United States Patent [19]

Citowsky

[11] Patent Number: 4,875,617
[45] Date of Patent: Oct. 24, 1989

[54] GOLD-TIN EUTECTIC LEAD BONDING METHOD AND STRUCTURE

[76] Inventor: Elya L. Citowsky, 1240 Holly St., San Carlos, Calif. 94070

[21] Appl. No.: 219,333

[22] Filed: Jul. 14, 1988

Related U.S. Application Data

[63] Continuation-in-part of Ser. No. 4,958, Jan. 20, 1987, abandoned.

[51] Int. Cl.$^4$ ............... B23K 31/02; H01L 23/48; H01L 29/54
[52] U.S. Cl. ............... 228/123; 228/180.2; 228/254; 228/263.12; 357/67; 357/71
[58] Field of Search ............... 228/123, 124, 180.2, 228/254; 29/840, 878; 428/610, 620; 357/65, 67, 71

[56] References Cited

U.S. PATENT DOCUMENTS

| | | | |
|---|---|---|---|
| 3,648,357 | 3/1972 | Green, Jr. ............... | 29/492 |
| 3,709,729 | 1/1973 | Hall II ............... | 357/67 |
| 3,821,785 | 6/1974 | Rose ............... | 357/67 |
| 3,850,688 | 11/1974 | Halt ............... | 357/67 |
| 3,986,255 | 10/1976 | Mandal ............... | 228/226 |
| 4,067,104 | 1/1978 | Tracy ............... | 29/626 |
| 4,142,202 | 2/1979 | Csillag et al. ............... | 357/67 |
| 4,518,112 | 5/1985 | Miller et al. ............... | 228/124 |
| 4,659,006 | 4/1987 | Polansky ............... | 228/123 |
| 4,673,772 | 6/1987 | Satoh et al. ............... | 228/180.2 |
| 4,688,075 | 8/1987 | Phy ............... | 228/123 |
| 4,745,036 | 5/1988 | Trevison et al. ............... | 357/71 |

FOREIGN PATENT DOCUMENTS

| | | | |
|---|---|---|---|
| 44901 | 12/1978 | Japan ............... | 228/123 |
| 8202457 | 7/1982 | PCT Int'l Appl. ............... | 228/123 |

OTHER PUBLICATIONS

Kawanobe et al, "Tape Automated Bonding Process For High Lead" IEEE, 1983.
IBM Technical Disclosure Bulletin, "Diffusion . . . Ceramic to Metal Bond", Sullivan, vol. 26, No. 8, pp. 4172–4173, Jan. 1984.

Primary Examiner—Nicholas P. Godici
Assistant Examiner—Samuel M. Heinrich
Attorney, Agent, or Firm—Flehr, Hohbach, Test, Albritton & Herbert

[57] ABSTRACT

A bonding structure of gold-tin (80:20) eutectic bonding of two gold layers on an integrated circuit chip and a substrate carrier, such as a tape in a tape automated bonding (TAB) process, is provided. A method provides gold-tin eutectic bumps on an integrated circit wafer or on the tape or other substrate carrier. The quantity of tin reacting with gold in the method is limited and controlled, allowing gold consumption to be reduced by an order of magnitude. A first layer of gold is provided on bonding pads of the wafer after formation of the integrated circuits. A layer of tin is formed on the first gold layer. The first gold and tin layers are thermally treated at a temperature above 280° C. to form gold-tin substantially eutectic bumps on the first gold layer. A second gold layer is provided as spots on the tape or other substrate carrier. The second gold layer has a thickness of at least about 5 percent of the gold rich eutectic body. After dicing the wafer into individual integrated circuit chips, the eutectic body on the chip's pads is placed on and bonded to the second gold layer by heating to a temperature greater than the temperature of the previous thermal treatment and leaving unalloyed gold in the first and second gold layers. The eutectic bumps can alternatively be made on the tape, with a thin gold layer on the wafer. The eutectic bumps can also be deposited directly as the gold-tin eutectic. The gold, tin or eutectic layers can be plated, sputtered, evaporated with or without use of a mask or photolithography, screened, chemical vapor deposited, or any combination of these techniques. The resulting structure has increased reliability, especially for on board application at elevated temperatures, due to avoiding brittle intermetallics. The method and structure allows smaller bonding pads to be used on integrated circuit chips, giving smaller chips with higher yields.

16 Claims, 2 Drawing Sheets

GOLD-TIN EUTECTIC LEAD BONDING METHOD AND STRUCTURE

ORIGIN OF APPLICATION

This application is a continuation-in-part of my previous application Ser. No. 07/004,958, filed Jan. 20, 1987, now abandoned.

BACKGROUND OF THE INVENTION

1. Field of the Invention

This invention relates to an improved method for bonding leads of semiconductor devices, such as integrated circuits, to conductive members using a eutectic composition of gold and tin and to the lead bonding structure obtained with the method. More particularly, it relates to such a method and structure in which the amount of tin reacting with gold is limited and the formation of brittle intermetallic compositions is avoided, thus increasing reliability at elevated temperatures.

2. Description of the Prior Art

Alloys of tin and gold are widely used in the bonding of semiconductor devices to conductive members. For example, bonding processes employing a eutectic composition of 80 weight percent gold and 20 weight percent tin are disclosed in Kadelburg, U.S. Pat. Nos. 3,158,471, issued Nov. 24, 1964 and Ainslie et al., 4,418,857, issued Dec. 6, 1983. Gold-tin lead bonding is commonly used in the semiconductor industry in the form described in *VLSI Technology* (Sze, S. M., ed.), McGraw-Hill, 1983, page 562. As disclosed there, gold bumps on the integrated circuits are bonded to tin coated copper tape. While this structure is heated to 280° C. to form an 80-20 gold-tin eutectic composition, the formation of brittle intermetallics in this process as conventionally employed cannot be avoided, because the quantity of tin reacting with the gold is unlimited or uncontrollable, which will be more fully explained below.

The process as described in the above text is generally satisfactory for use with many integrated circuits, but it suffers from low reliability for on board applications at elevated temperatures, such as above 125° C., especially in combination with thermal cycling and/or mechanical shock and vibration. Disadvantages associated with this process include potential reliability problems resulting from a combination of elevated temperatures, mechanical shocks and/or thermal cycles, due to the creation of brittle intermetallics, and a difficult-to-control bonding process.

The development of gate arrays and similar very large scale integration (VLSI) and very high speed integrated circuit (VHSIC) devices with leads numbering in the hundreds has resulted in increased demands on device bonding technology and makes usage of a simultaneous bonding process an economic and technical necessity. Such devices having an increased number of leads require a higher reliability of bonding, a fully controllable process of achieving a metallurgical bond and simultaneously, an increase in the density of bonding pads on the integrated circuit chips. The requirements for such VLSI and VHSIC devices are described more fully in Marshall, J. F. and Sheppard, R. P., "New Applications of Tape Bonding for High Lead Count Devices", *Semiconductor Processing, ASTM STP* 850. (Gupta, D. C., ed.) American Society for Testing and Materials, 1984.

A proposed approach for meeting the demands for bonding such chips having a high number of leads is through thermocompression or ultrasonic bonding of gold bumps on the chips with gold spots on a tape. Thermocompression or ultrasonic bonding provides a good electrical contact, bu sometimes produces a poor metallurgical bond. Poor metallurgical bonds are very difficult to detect and can result in a significant reliability problem due to premature failure of such bonds in use of the chips.

Another lead bonding process that has been employed in the prior art is the use of controlled collapse solder bumps. However, problems have been encountered adapting the controlled collapse technique to surface mounted devices, since the controlled collapse solder bumps and the tin-lead alloys used for surface mounting have the same eutectic points, and with reliability of the controlled collapse solder bumps at elevated temperatures.

It is also known to provide a hermetically sealed semiconductor device package by disposing a gold-tin eutectic alloy preform between a cover and a supporting member for the semiconductor device, and fusing the cover to the supporting member with the preform. Such a process is disclosed, for example, in U.S. Pat. No. 4,232,814, issued Nov. 11, 1980 to Norman. Very reliable sealing is accomplished in this manner, but such a process cannot be used for bonding leads of integrated circuit chips to a conductive substrate.

A similar process is disclosed for backside contact bonding of integrated circuit devices to carrier substrates in *VLSI Technology* (Sze, S. M., ed.), McGraw-Hill, 1983, page 553. As in the case of package sealing, the use of such preforms is not possible for bonding leads on the front of a integrated circuit chip.

SUMMARY OF THE INVENTION

Accordingly, it is an object of this invention to provide a method and structure for bonding a lead of an integrated circuit chip to a conductive member which includes formation of an 80-20 gold-tin eutectic alloy metallurgical bond and which is free of brittle intermetallics, as a result of limiting tin quantity reacting with the gold, thus increasing the reliability of the lead bonded integrated circuit chip, especially at elevated temperatures.

It is a further object of the invention to provide such a method and structure which will allow a substantial increase in lead density with reliable bonding, thus reducing integrated circuit chip size by allowing smaller contact bumps, which increases chip yield.

It is another object of the invention to provide such a method and structure which substantially reduces amount of gold required for the bonding.

It is still another object of the invention to provide such a method and structure which is independent of the material used for the conductive member.

It is yet another object of the invention to provide such a method and structure which is compatible with tape automated bonding.

It is a further object of the invention to provide such a lead bonding method which is compatible with soldering processes used in surface mounting of integrated circuit devices.

The attainment of these and related objects may be achieved through use of the novel lead bonding method and structure herein disclosed. In a lead bonding method according to the invention, a gold-tin eutectic bonding structure for an integrated circuit chip is provided. A first layer of gold is provided on a bonding pad on the integrated circuit chip. A layer of tin is formed on the first gold layer. The tin layer has a weight less than about one sixth of the first gold layer, which typically represents a thickness less than about one half of the gold layer. The first gold and tin layers are thermally treated at a temperature above 280° C. to form a gold-tin substantially eutectic body on the bonding pad. A second gold layer is provided on a substrate carrier, which may be a tape of the type used in tape automated bonding (TAB), a leadframe, or the like. The second gold layer has a thickness of at least about 5 percent of a thickness of the gold-tin substantially eutectic body. The gold-tin substantially eutectic body is placed on the second gold layer. The gold-tin substantially eutectic body is bonded to the second gold layer by heating the gold-tin substantially eutectic body and the second gold layer to a temperature greater than the temperature of the previous thermal treatment. Alternatively, the gold-tin eutectic body may be directly deposited, and the thermal treatment step omitted.

A lead bonding structure in accordance with the invention attaches leads of an integrated circuit chip to a tape, leadframe or other substrate carrier. The bonding structure includes a conductive metal bonding pad on the chip and a gold region on the substrate carrier. A first gold layer is on the conductive metal bonding pad. A gold-rich 80 percent by weight gold-20 percent by weight tin eutectic body is between and bonds the first gold layer and the gold region. The gold region on the substrate carrier has a thickness greater than about 5 percent of a thickness of the gold-tin substantially eutectic body.

In a preferred form of the method and structure, the gold and tin layers or the directly deposited gold-tin eutectic body have a relative weight and/or content so that the gold-tin substantially eutectic body formed is enriched with gold. Such gold enrichment assures that the formation of brittle gold-tin intermetallics will be avoided.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figure 1:
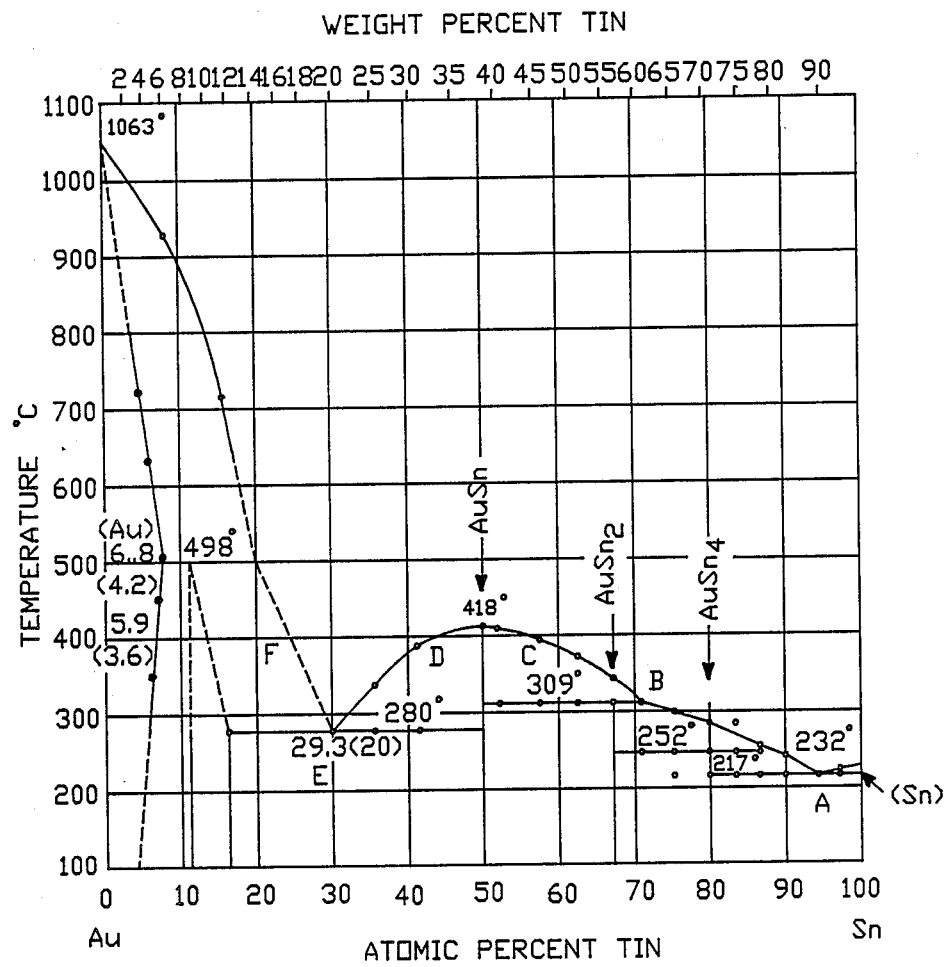
FIG. 1 is a gold-tin metallurgical phase diagram useful for understanding the invention.
Figure 2:
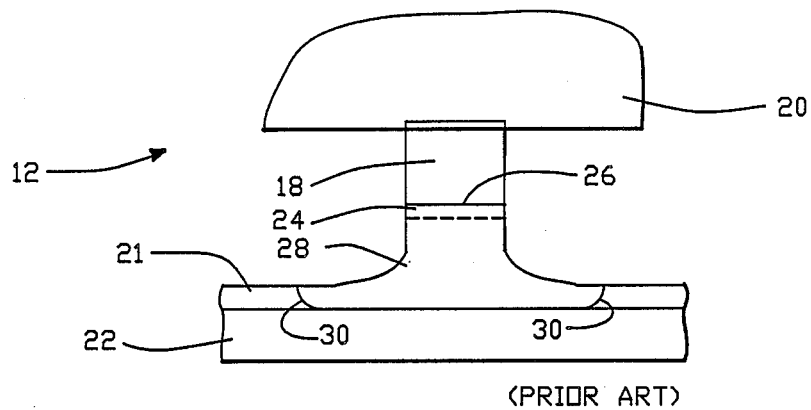
FIG. 2 is a cross-section of a prior art structure resulting from a conventional bonding method.
Figure 3:
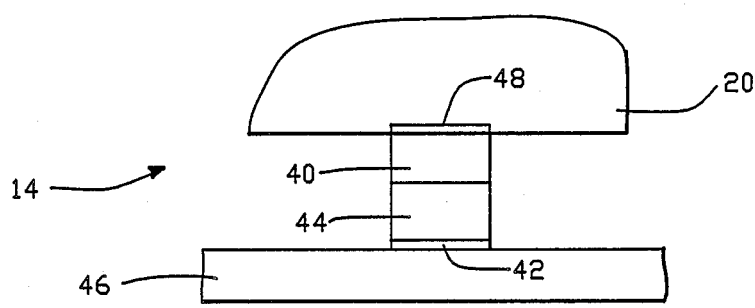
FIG. 3 is a cross-section of a structure in accordance with the invention, obtained with a bonding method in accordance with the invention, with a eutectic alloy on an integrated circuit chip.
Figure 4:
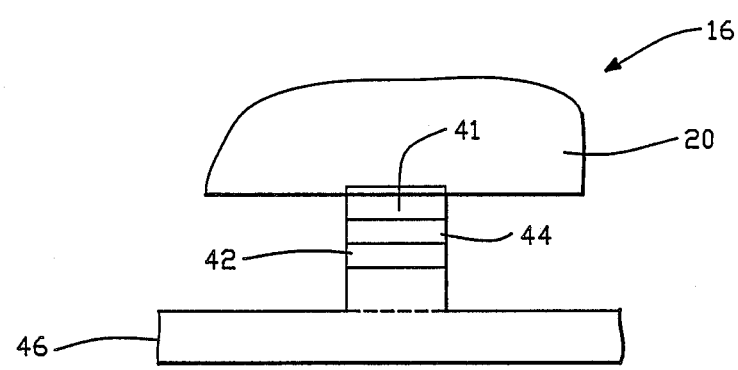
FIG. 4 is a cross-section of another embodiment of a structure in accordance with the invention, with a eutectic alloy on a substrate carrier, obtained with another embodiment of a bonding method in accordance with the invention.

Turning now to the drawings, more particularly to FIG. 1, there is shown a phase diagram, which is useful both for understanding problems associated with prior art structure 12 shown in FIG. 2 and the advantages of structures 14 and 16 of the invention, shown in FIGS. 3 and 4, respectively. When gold (Au) and tin (Sn) are brought together and heated, as in the conventional method of bonding gold bumps 18 on chip 20 to tin 21 plated tape 22 (FIG. 2), a leadframe or a substrate carrier, a first liquid phase will be a eutectic between $AuSn_4$ and Sn at a temperature of 217° C., represented by the point A in FIG. 1. This eutectic contains about 90 weight percent tin and about 10 weight percent gold. When, during the bonding method, the temperature is increased to 280° C., a 80-20 gold-tin eutectic region 24 is formed at gold boundary 26. This eutectic region 24 corresponds to point E on the phase diagram 10 of FIG. 1. When the temperature is further increased, the content of tin in the alloy at the boundary 26 decreases in accordance with the curve EF in FIG. 1, and the boundary 26 also moves as a result of gold dissolving in the tin 21.

As the temperature continues to increase, the content of gold in alloy 28 close to boundary 30 with the tin 21 also increases in accordance with the curve AB in FIG. 1. At a temperature of 309° C., a peritectic with $AuSn_2$ is formed, corresponding to the point B in FIG. 1. At a temperature above 309° C. and below 418° C. there is a mix of liquid and solid phases of gold-tin intermetallics, and the content of tin (or gold) is different at the gold boundary 26 on the chip 20 and the tin boundary 30 on the tape 22. As a result, the mix 28 contains several compositions between points F and C in FIG. 1. There is never an equilibrium for the whole structure 12, otherwise all of the gold 18 would be consumed by the tin 21.

The bonding temperature is always kept below 418° C.; otherwise more tin 21 from the plated tape 22 could react with the gold 18 and consume it. In addition, some devices 20 cannot stand a bonding temperature above 418° C. As a result of cooling from a temperature below 418° C. and above 309° C. with an almost unlimited or uncontrollable tin supply, such as from the tin 21 plated on the tape 22, extremely brittle intermetallics are precipitated close to the tin boundary 30. Additionally, brittle intermetallics are formed between the tin and the material of the tape 22, typically a copper alloy or a nickel alloy. The composition of the precipitates is accordingly represented by the curves DE and/or CA in FIG. 1. At the gold boundary 26, the composition of precipitates is represented by the curve FE in FIG. 1. The temperature gradient during the cooling can further complicate the composition at the boundaries 30 and 26. In practice, the actual bonding temperature in wide use is about 360° C., and FIG. 2 represents a typical structure obtained with that bonding temperature. Using a bonding temperature above 418° C. changes metallurgy of the method very little, reducing the time of the metallurgical reaction between the gold and the tin, but creating other serious problems.

Numerous factors make the method of gold-tin bonding with tin plated parts uncontrollable. Among these factors are thickness of the tin layer; composition of the tin layer, which may contain organic and inorganic impurities, depending on the plating method employed; the time between plating and bonding, which may allow oxidation, changing the viscosity of the tin in liquid form; the temperature and temperature gradient during the bonding, which is a function of a carrier for the parts being bonded, the area of the mechanical contact of the parts with the carrier and speed of a transport belt for moving the parts and the carrier through a continuous furnace and material of the substrate to which the parts are bonded. All these factors can affect the reliability of devices.

Each micron of tin 21 plating on the tape 22 can consume between 2–40 microns of the gold bump 18, depending mainly on the bonding temperature and properties of the tin plated layer 21. A typical bump thickness or height of about 25 microns is therefore provided. From about 5 to about 8 microns of the 25 microns thickness is needed to space the chip 20 from the tape 22 in the completed structure 12. In order to deposit or plate a thickness of 25 microns of gold, either two or three photoresist applications or the use of a solid photoresist are required. This thickness of gold also produces an unnecessary increase in the size of the bonding pads or bumps and in the distance between bumps. Gold consumption is also rather significant.

Due to the creation of brittle intermetallics and difficulties with process control, reliability of the structure 12 is relatively low, especially for on board applications at elevated temperatures, such as above 125° C., and especially in combination with thermal cycling and/or thermal shocks. The process of creating brittle intermetallics continues, even at temperatures just above room temperature. For these reasons, the use of gold plating for external connections with solder that contains tin is objectionable for military applications. In summary, the conventional gold-tin bonding process producing the structure 12 shown in FIG. 2 produces a good eutectic bonding on one side of a solder joint and bad intermetallic bonding on the other side.

True eutectic bonding for sealing packages with preforms is very reliable. To obtain such seals, the semiconductor industry uses gold-tin preforms having a gold content between 77 and 80 weight percent for bonding two parts each having gold covered surfaces. The gold content below 80 weight percent in the preforms is to make up for the gold on the parts to be bonded and to reduce the bonding temperature. Preforms having a gold content below 77 weight percent, i.e., a tin content above 23 weight percent, are extremely brittle and difficult to use. Typically, the bonding alloy after completion of the bonding is more gold rich than the 80-20 gold-tin eutectic composition. The bonding temperature is usually about 330° C. and the gold-tin ratio is above 4:1 by weight. Cooling after bonding is in accordance with curve EF in FIG. 1.

Use of preforms is impractical for bonding integrated circuit devices to supporting substrates due to the high number of contact leads on such devices and the small dimensions of bonding pads. A different approach is therefore required to obtain true eutectic bonding for this purpose.

As shown in FIGS. 3 and 4, the above disadvantages of the prior art structures are overcome in the structures 14 and 16 by having a metallurgical bond of two gold layers 40 and 42 joined by a gold-tin eutectic layer 44 enriched with gold. Due to a limited amount of tin to form such a structure, one micron of tin on a contact bump on the chip 20 will produce only about 3 microns of the gold-tin eutectic layer 44 and consumes about 2 microns of the gold from the bump. Due to the steep angle of the curve EF, even at a bonding temperature of 400° C., 3 microns of gold-tin eutectic cannot consume more than an additional 0.2 micron of the gold, and the amount of gold consumed increases only slightly with increasing temperature. For practical purposes, the amount of tin on the bump can be close to 0.5 micron, and consumption of the gold from the bump limited to about 1 micron. While a bump height of about 5 microns is typically required to be about 5 microns to space the chip 20 from tape 46, a finger can be provided on the tape to eliminate the need for such a bump height. For simplicity, only a single structure in accordance with the invention bonding the chip 20 to the tape 46 is shown. In practice, one hundred or more such structures are typically formed between an integrated circuit chip 20 and the tape 46 in a TAB process.

The structure 14 of FIG. 3 is fabricated in the following manner: The whole surface of a wafer, with integrated circuits and bonding pads 48 formed on the wafer in a conventional manner, is covered with a continuous, conductive metal layer, such as copper, gold, silver, palladium or aluminum. The wafer is then coated with a photoresist which is stable in gold and tin plating solutions and patterned to leave the bonding pads 48 open for plating. The layer 40 of gold is then plated on the bonding pads 48, followed by a layer of tin, with the tin layer having a quantity of tin less than one-sixth the quantity of gold by weight, if bonding temperatures below 400° C. are employed, less than one-seventh the quantity of gold by weight if a bonding temperature of 500° C. is employed. The photoresist and uncovered continuous metal layer are then stripped, followed by heat treatment of the wafer above 280° C. to form the gold-tin eutectic layer 44 enriched with gold on the bonding pads 48. The wafer is then diced into separate integrated circuits. The resulting chips 20 are then bonded by means of the gold-tin layer 44 to golden pads 42 or bumps having a thickness more than about 5 percent of the thickness of the gold-tin layer 44 on the tape 46, using a bonding temperature above that of the thermal treatment.

Other deposition processes than plating can be used to form the gold and tin layers. For example, they can be deposited by vacuum evaporation or sputtering, with use of either photolithography to etch the bumps or a lift-off photolithography process to remove the metals except on the bonding pads 48. Vacuum evaporation through a mask can also be employed. With these techniques, the continuous conductive metal layer prior to the gold and tin deposition is not necessary. A screening process or a chemical vapor deposition process could also be used to form the gold and tin layers. With all of these alternatives, the ratio of approximately 6:1 by weight of gold to tin should be observed in accordance with the curve EF in FIG. 1, for bonding temperatures below 450° C.

The thermal treatment before bonding allows better control of the bonding method and results in some saving of gold. With use of the thermal treatment, for 1 micron of tin on the bump, approximately 2.3 microns of gold is needed on the bump side to react with the tin, and less than 0.2 micron is required on the tape side. Without the thermal treatment, about 1.5 micron of gold is needed on each side, and the temperature gradient during bonding must be controlled or eliminated.

The direct deposition of gold-tin eutectic, at substantially 80% by weight of gold is also possible. In In this case, approximately 0.2 micron of gold for 3 microns of gold-tin eutectic still need to be deposited on each side of the bonding joint. This can be done either with use of a gold-tin eutectic target for sputtering or sputtering from two sources, observing the eutectic's stoichiometry. A plating process or screening process that would deposit the gold-tin eutectic directly could also be designed. In these cases, the thermal treatment at the temperature above 280° C. before bonding is not necessary.

The structure 16 of FIG. 4 is formed by reversing the locations of the gold-tin eutectic bumps and the gold pads. The bumps are provided on the tape 46 and gold pads 41 are provided on the chip 20. In other respects, the structure 16 is fabricated in the same manner as the structure 14 of FIG. 3.

In a particular process sequence suitable for use with TAB, a wafer having integrated circuits and bonding pads formed is covered with continuous, conductive metal layers for plating, such as by the sequential sputtering of TiW to a thickness of 0.1 micron and Cu to a thickness of 1 micron. Photoresist is applied and patterned to leave the bonding pads open for plating. Gold is then plated to a thickness of between 4 and 6 microns. Tin is plated to a thickness of less than 1 micron. The photoresist pattern is stripped and the continuous metal layer is removed, except on the bonding pads. The gold and tin plated layers are subjected to thermal treatment at a temperature of about 310° C. The wafer is diced into integrated circuit chips. The gold-tin eutectic layer formed by the thermal treatment on each bonding pad is then placed in registration with gold spots on a tape and bonded in a tape automated bonding process.

It should now be readily apparent to those skilled in the art that a novel gold-tin eutectic bonding method and structure capable of achieving the stated objects of the invention has been provided. The method and structure allow a chip's size to be reduced by allowing smaller contact bumps. This increases chip yield and simultaneously increases bond reliability. The method and structure of this invention can be used for automated assembly, including highly reliable tape automated bonding (TAB) of gate arrays and other VLSI/VHSICs with high lead counts, especially for on board applications at elevated temperatures. The method and structure of the invention are suitable for use with surface mounted devices, because the 280° C. melting point of the gold-tin eutectic is substantially above the 183° C. melting point of the conventionally used tin-lead alloys used for surface mounting. The reliability of the bond structures is independent of the material used for the substrate carrier, whether tape or a leadframe.

It should further be apparent to those skilled in the art that various changes may be made in form and details of the invention as shown and described. It is intended that such changes be included within the spirit and scope of the claims appended hereto.

What is claimed is:

1. A method for making a gold-tin alloy bonding structure for an integrated circuit chip having a plurality of bonding pads, which comprises forming a first layer of gold on a substrate carrier, forming a second gold layer on said integrated circuit chip, forming an at least 80 weight percent gold-tin alloy body on at least one of said first and second gold layers, said first and second gold layers each having a thickness of at least about 5 percent of a thickness of said at least 80 weight percent gold-tin alloy body, placing said at least 80 weight percent gold-tin alloy body between said first and second gold layers, and bonding said at least 80 weight percent gold-tin alloy body to said first and second gold layer by heating said at least 80 weight percent gold-tin alloy body and said first and second gold layers to a temperature sufficient to bond said at least 80 weight percent gold-tin alloy body and said first and second gold layers together to provide the bonding structure in which said at least 80 weight percent gold-tin alloy body is gold enriched and a portion of said first and second gold layers remain unalloyed.

2. The method of claim 1 in which said second gold layer is provided simultaneously on a plurality of said integrated circuit chips on a wafer, and said wafer is diced into individual integrated circuit chips prior to placing said at least 80 weight percent gold-tin alloy body between said first and second gold layers.

3. The method of claim 2 in which said first gold layer, said at least 80 weight percent gold-tin alloy body and said second gold layer are patterned to correspond to the bonding pads on said plurality of integrated circuits prior to placing said at least 80 weight percent gold-tin alloy body between said first and second gold layers.

4. The method of claim 3 in which said gold-tin substantially eutectic body is formed by vapor deposition.

5. The method of claim 3 in which said gold-tin substantially eutectic body is formed by plating.

6. The method of claim 3 in which said gold-tin substantially eutectic body is formed by screening.

7. The method of claim 3 in which said first gold layer is formed by vapor deposition.

8. The method of claim 3 in which said first gold layer is formed by plating.

9. The method of claim 3 in which said first gold layer is formed by screening.

10. The method of claim 3 in which said second gold layer is formed by vapor deposition.

11. The method of claim 3 in which said second gold layer is formed by plating.

12. The method of claim 3 in which said second gold layer is formed by screening.

13. The method for making a gold-tin alloy bonding structure for an integrated circuit chip of claim 1 in which said at least 80 weight percent gold-tin alloy body is deposited on said second gold layer by forming a layer of tin on said second gold layer and thermally treating said second gold and tin layers at a temperature above 280° C. to form said at least 80 weight percent gold-tin alloy body on said integrated circuit chip.

14. The method for making a gold-tin alloy bonding structure for an integrated circuit chip of claim 1 in which said at least 80 weight percent gold-tin alloy body is formed on said first gold layer by forming a layer of tin on said first gold layer and thermally treating said first gold and tin layers at a temperature above 280° C. to form said at least 80 weight percent gold-tin alloy body on said substrate carrier.

15. The method for making a gold-tin alloy bonding structure for an integrated circuit chip of claim 1 in which said at least 80 weight percent gold-tin alloy body is formed on at least one of said first and second gold layers by deposition.

16. A bonding structure attaching an integrated circuit chip to a substrate carrier, which comprises a plurality of conductive metal bonding pads on said integrated circuit chip, a like plurality of gold regions on said substrate carrier patterned to correspond to said plurality of conductive metal bonding pads, a first gold layer on each of said conductive metal bonding pads, and an at least 80 percent by weight gold-tin alloy body between and bonding said first gold layer on each of said plurality of conductive metal bonding pads and each of said like plurality of gold regions, a portion of said like plurality of gold regions and said first gold layer between which said at least 80 weight percent by weight gold-tin alloy body is located being unalloyed.

* * * * *